United States Patent [19]

Miwa

[11] Patent Number: 5,352,617

[45] Date of Patent: Oct. 4, 1994

[54] METHOD FOR MANUFACTURING BI-CMOS TRANSISTOR DEVICES

[75] Inventor: Hiroyuki Miwa, Kanagawa, Japan

[73] Assignee: Sony Corporation, Tokyo, Japan

[21] Appl. No.: 51,520

[22] Filed: Apr. 26, 1993

[30] Foreign Application Priority Data

Apr. 27, 1992 [JP] Japan .................................. 4-134300
May 27, 1992 [JP] Japan .................................. 4-160267

[51] Int. Cl.$^5$ .......................................... H01L 21/265
[52] U.S. Cl. ........................................ 437/34; 437/26; 437/31; 437/32; 437/33; 437/57
[58] Field of Search ................... 437/34, 31, 32, 33, 437/26, 57, 162, 909; 148/DIG. 8, DIG. 9

[56] References Cited

U.S. PATENT DOCUMENTS

| 4,703,554 | 11/1987 | Havemann | 437/31 |
| 4,729,965 | 3/1988 | Tamaki et al. | 437/31 |
| 5,028,557 | 7/1991 | Tsai et al. | 148/DIG. 9 |
| 5,089,430 | 2/1992 | Owada et al. | 437/31 |
| 5,124,270 | 6/1992 | Morizuka | 437/31 |
| 5,132,234 | 7/1992 | Kim et al. | 148/DIG. 9 |
| 5,147,818 | 9/1992 | Hikida | 148/DIG. 9 |
| 5,232,861 | 8/1993 | Miwa | 437/162 |

Primary Examiner—Tom Thomas
Assistant Examiner—Kevin M. Picardat
Attorney, Agent, or Firm—Hill, Steadman & Simpson

[57] ABSTRACT

A method of manufacturing a semiconductor device having a bipolar transistor and a MOS transistor is disclosed, which comprises covering the bipolar transistor formation region with a gate insulating film and also with a first gate formation material at the time of the MOS transistor gate formation, removing the first gate formation material and gate insulating film covering at least a portion of the bipolar transistor formation region, thus forming an opening in the gate insulating film and first gate formation material, forming a second gate formation material, removing other portion of the first and second gate formation materials than on the bipolar transistor formation region and the MOS transistor gate formation region, forming an inter-layer insulating film, and removing the inter-layer insulating film and first and second gate formation materials on at least a portion of the bipolar transistor formation region, thus forming a second opening in the first-mentioned opening in the inter-layer insulating film and first and second gate formation materials.

8 Claims, 11 Drawing Sheets

METHOD FOR MANUFACTURING BI-CMOS TRANSISTOR DEVICES

BACKGROUND OF THE INVENTION

1. Field of the Invention

The present invention relates to a method of manufacturing semiconductor devices and, more particularly, to a method of manufacturing a semiconductor device having a bipolar transistor and a MOS transistor (such transistor combination being hereinafter sometimes referred to as Bi-CMOS transistor) such as to preclude deterioration and improve the characteristics of the bipolar transistor.

2. Description of the Related Art

Bi-CMOS LSI, which has the merits of the high density integration capacity and low power consumption of the CMOS transistor and high speed operation of the bipolar transistor, is attracting attention in view of recent demands for further LSI scale increase and performance improvement. In the process of manufacturing the Bi-CMOS LSI, however, the inter-element isolation technique has problems as will be described.

In the process, the oxide film thickness can not be made excessively large in order to reduce conversion difference due to the commonly termed bird's beak generated at the time of LOCOS. For example, in a CMOS process with a gate length condition of 0.3 to 0.5 $\mu$m, the oxide film thickness is 0.25 to 0.4 $\mu$m.

Meanwhile, in the bipolar transistor it is necessary to separate an epitaxial layer usually of the order of 1.0 m with a LOCOS oxide film or with a LOCOS oxide film and a p-n junction. This means that the oxide film thickness is 0.8 to 1.0 $\mu$m.

The inventor has earlier proposed to solve this problem by etching semiconductor layer portion around the bipolar transistor (as disclosed in Japanese Patent Application No. 35110/91). The proposed technique will now be described with reference to FIGS. 1-A to 1-G.

(a) In the first place, a Psub <100> substrate 10 is prepared, and a buried layer 1 is formed in a bipolar transistor region of the substrate by Sb diffusion or like well-known method.

Then, an n-epitaxial layer 2 with $\rho$ of 1.0 $\Omega$·cm and t of 1.0 $\mu$m is formed with epitaxial techniques.

Then, substrate Si is etched with usual dry etching techniques. This etching permits sufficient inter-element isolation to be obtained even when the LOCOS film thickness is small. In the process, the substrate is etched by about 400 nm by taper etching using a blend gas composed of SiCl4 and N2 (see FIG. 1-A).

(b) Then, an inter-element isolation insulating film 11 is formed with usual LOCOS techniques. At this time, the LOCOS oxide film thickness is set to about 400 nm. Setting the oxide film thickness to be excessive leads to increase of the inter-element isolation region due to commonly termed bird's beak or generation of substrate Si crystal defects due to stress generated at the time of selective oxidization. In a subsequent step, a collector electrode 7 is formed in a collector electrode region of the bipolar transistor by ion implanting P+ using a resist mask (see FIG. 1-B).

Further, a p+-type region 4 is formed in the isolation region by ion implanting B+ through the LOCOS oxide film.

(c) Then, oxidization is carried out; for instance steam oxidization is carried out at 350° C. for about 15 minutes, thus forming an oxide film 12 having a thickness of about 15 nm.

Then, poly Si 21 of about 50 nm is formed over the entire surface by a reduced pressure CVD process.

Then, a resist is formed to cover the entire surface, and its portion on the base electrode region of the bipolar transistor is selectively etched away.

Then with this patterned resist as a mask, the poly Si oxide layer is etched by RIE.

This etching is carried out in two steps, comprising a first step of etching poly Si with SF6/C2Cl2F3 gas and a second step of etching SiO2 with O2/CHF3 gas (see FIG. 1-C).

(d) Then, a second poly Si layer 22 of about 50 nm is formed by the reduced pressure CVD, and then a high-melting metal marterial, e.g., WSix 23, with a thickness of about 100 nm, is formed by the CVD process.

Then, a resist is formed and patterned such as to cover a base electrode region.

With this patterned resist as a mask, the WSix, second poly Si layer and first poly Si layer are then etched by RIE. This etching is done by using SF6/C2Cl3F3 gas.

Then, an insulator, e.g., SiO2 24, is formed to a thickness of about 300 nm by the CVD process. (FIG. 1-D).

(e) Then, a resist is formed over the entire surface, and its portion on an emitter/base formation region of the bipolar transistor is etched away. With this patterned resist as a mask, the SiO2, WSix and poly Si in the emitter/base formation region are etched away. The etched part is designated at 20.

The etching is done in two steps, i.e., a first step of etching SiO2 with O2/CHF3 gas and a second step of etching WSix and poly Si with SF6/C2Cl3F3 gas.

In the second step of etching, sufficient selection ratio can be taken for SiO2. Thus, SiO2 22 can remain on the emitter/base formation region, and no etching damage is caused (FIG. 1-E).

(f) Then, a link base region is formed by ion implanting BF2.

Then, a SiO2 spacer 25 is formed by carrying out CVD and RIE of SiO2 continuously. For example, a side wall width of 0.2 to 0.3 m can be obtained under the conditions of SiO2 CVD to 500 nm and RIE overetching of 10%, thus realizing an emitter/base contact width of a quarter $\mu$m.

Subsequently, an emitter poly Si layer 26 of about 100 nm is formed by the reduced CVD process.

Then, emitter/base is formed by B+ ion implantation, As+ ion implantation and then a heat treatment. Then, the poly Si is etched away while leaving the emitter electrode region (FIG. 1-F).

(g) Then, an insulator, e.g., SiO2 27 is formed to a thickness of about 300 nm by the CVD process.

Then the SiO2 layer 27 on emitter/base/collector contact is etched away using a resist mask. Then, a metal lead 28 of Ti/TiN/Al-Si or polypoly Si/W silicide is formed on the entire surface and patterned with a regist mask, thus forming electrodes 3E, 3B and 3C. Thus, a bipolar transistor is completed (FIG. 1-G).

In the above example, the depth of diffusion in the formation of a high impurity concentration layer for the collector electrode may be made less than that in the prior art by removing the semiconductor layer in the collector electrode region.

However, as shown in FIG. 1-B, the ion implantation process for the formation of the high impurity concentration layer for the collector electrode is still necessary, which is undesired in view of the process step reduction.

Further, the ion implantation step requires high dose ion implantation usually of the order of $10^{15}$ cm$-2$ in terms of the dose, thus posing the problem that separation of the resist after the ion implantation is very difficult.

Further, the process of manufacturing Bi-CMOS has problems which will now be discussed by showing the process.

FIGS. 2-A to 2-H are fragmentary sectional views showing an upper portion of part of a silicon substrate including a bipolar transistor region and a channel PMOS transistor region in the process of manufacturing a Bi-CMOS transistor by the prior art method.

In the prior art method, as shown in FIG. 2-A, an n$--$type layer 31 is formed in the a bipolar transistor collector region and also in a PMOS transistor region, a p-type isolation 32 in a region of isolating the individual devices of the bipolar transistor and the CMOS transistor, a p$--$type layer 33 in a biplar transistor base region, and a p+$-$type layer 34, a field oxide film 35 and an oxide film 37' in a PMOS transistor source/drain region. Then, poly Si is formed over the entire surface of the Si substrate 30 by the reduced pressure CVD process. Then, the poly Si is removed by RIE such as to leave poly Si in a CMOS transistor gate electrode region.

Then, an oxide film is formed over the entire surface of the Si substrate by the reduced pressure CVD process, and it is then entirely etched back by RIE. As a result, a side wall oxide film 38 is formed on the side wall surfaces of poly Si 36a in the CMOS transistor gate electrode region, as shown in FIG. 2-B.

Then, a p+$-$type layer 34 is formed by implanting P ions in the p-channel MO8 transistor source/drain region.

Then, as shown in FIG. 2-C, an oxide film 37 is formed by thermal oxidization, and then a BPSG film 39 is formed by the normal pressure CVD process.

Then, as shown in FIG. 2-D, contact holes are formed by RIE in portions corresponding to bipolar transistor base, emitter and collector electrode formation regions. Then, as shown in FIG. 2-B, poly Si 36 is formed over the entire Si substrate surface by the reduced pressure CVD process. Then, as shown in FIG. 2-F, other poly Si 36 than poly Si 3c in the base, emitter and collector electrode regions is etched away by RIE.

Then, as shown in FIG. 2-G, contact holes are formed by RIE in the CMOS transistor source and drain electrode regions. Then, as shown in FIG. 2-H, Al is deposited and then selectively etched away by RIE such as to leave it on the electrode regions of the bipolar transistor and the CMOS transistor. Thus, a base, an emitter and a collector electrode 30B, 30E and 30C and also a source and a drain electrode 39S and 30D are formed.

In the above prior art method, however, in the step of obtaining the structure shown in FIG. 2-E by RIE etching back the oxide film 37' shown in FIG. 2-A formed by the CVD process over the entire Si substrate surface, the Si substrate surface is also etched in the active region 31a of the bipolar transistor. In addition, in the step of RIE forming the contact holes in portions corresponding to the bipolar transistor base, emitter and collector electrode regions as shown in FIG. 2-D, the Si substrate surface is etched in the individual electrode regions. In this way, in the prior art process even the Si substrate surface active region which is not desired to be etched is etched, thus resulting in the bipolar transistor characteristic deterioration.

To solve the above problem of the etching damage, it may be thought to use wet etching in lieu of RIE in the step shown in FIG. 2-D. In this case, however, fine processing can not be obtained due to the character of isotropic etching carried out as the wet etching.

Further, in the prior art process the emitter and base electrodes are formed such that they are separated from each other. This means a transistor size increase, thus leading to the parasitic capacitance increase and integration density reduction, which is undesired from the standpoints of various characteristics.

OBJECTS AND SUMMARY OF THE INVENTION

A first object of the invention is to dispense with the ion implantation step for high impurity concentration layer formation, thus reducing the number of necessary steps.

A second object of the invention is to provide a method of manufacturing a semiconductor device, which can alleviate the problem of the resist separation.

A third object of the invention is to provide a method of manufacturing a semiconductor device, which can preclude the bipolar transistor characteristic deterioration and contribute to the characteristic improvement.

DETAILED DESCRIPTION OF THE PREFERRED EMBODIMENTS

Specific preferred embodiments of the invention will now be described with reference to the drawings, it being understood that these embodiments are by no means limitative.

Figure 1A:
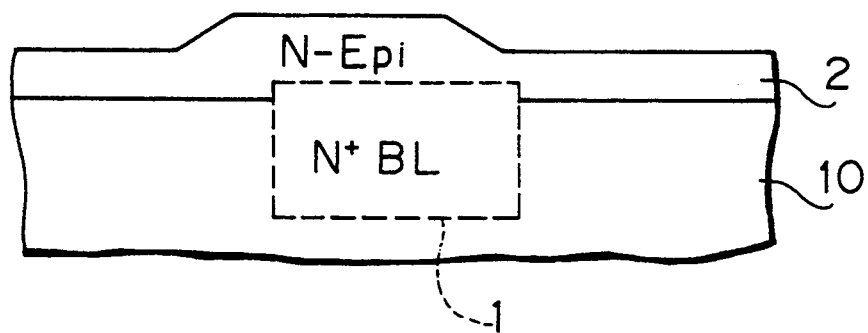
FIGS. 1-A to 1-G are fragmentary sectional views showing wafers in a prior art process of manufacturing a bipolar transistor.
Figure 1B:
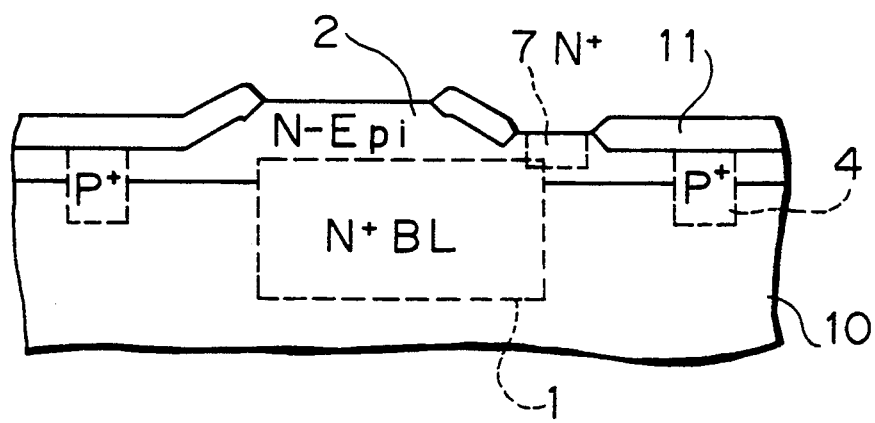
Figure 1C:
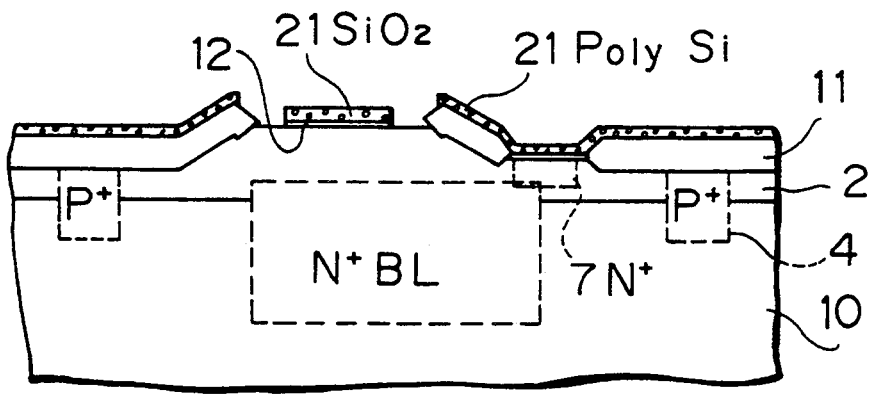
Figure 1D:
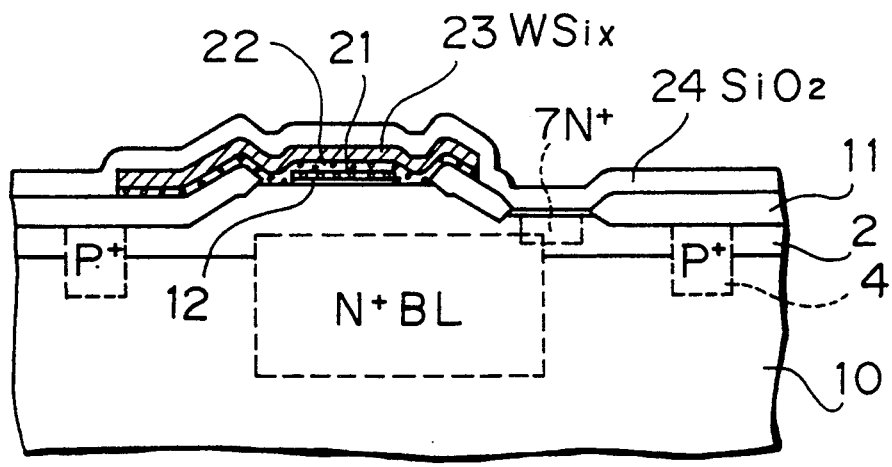
Figure 1E:
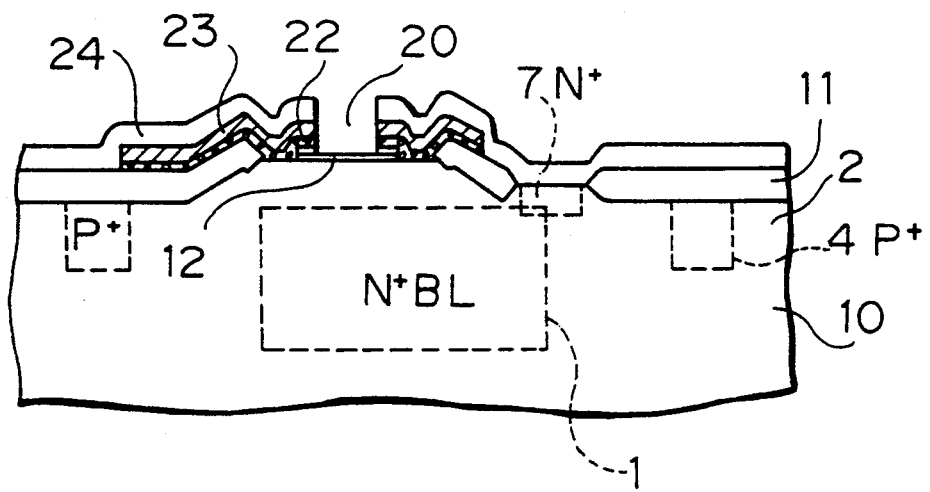
Figure 1F:
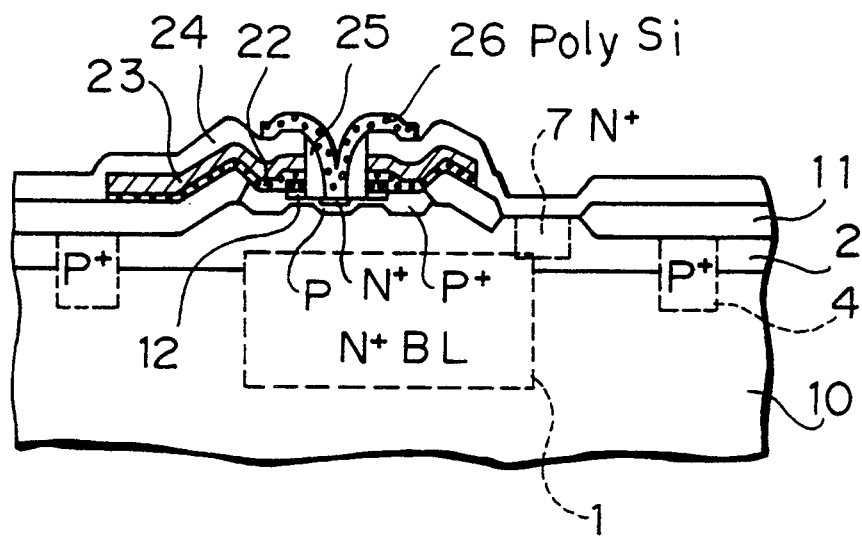
Figure 1G:
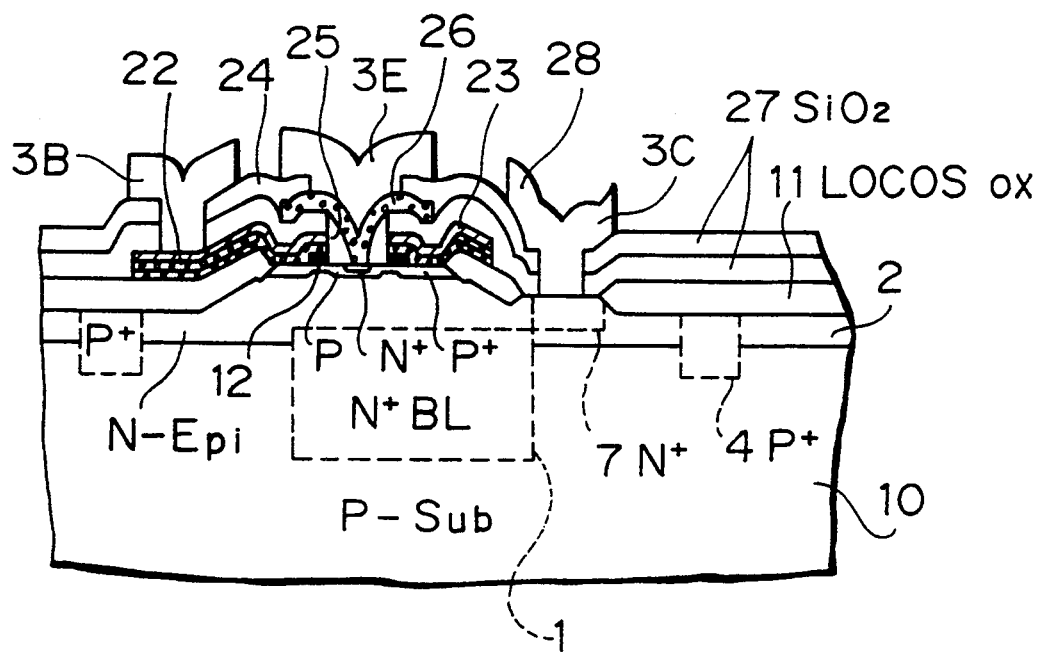
Figure 2A:
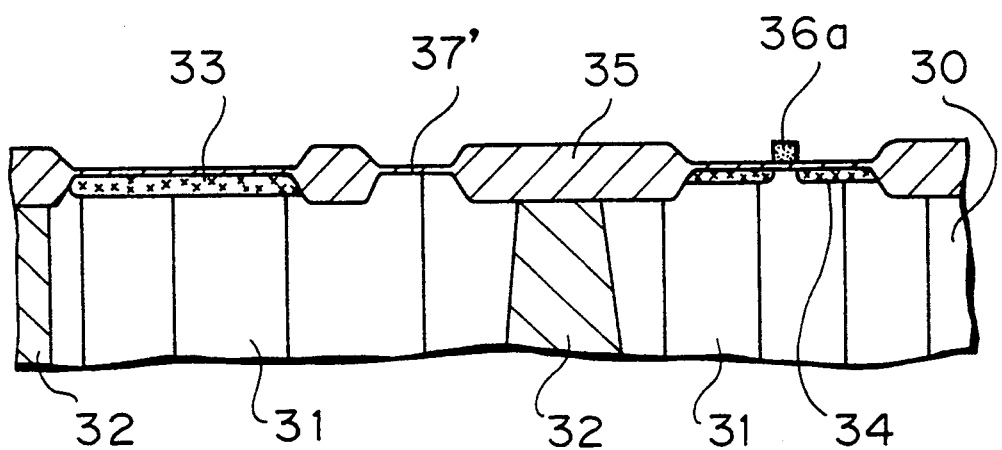
FIGS. 2-A to 2-H are fragmentary sectional views showing wafers in a prior art process of manufacturing a Bi-CMOS transistor.
Figure 2B:
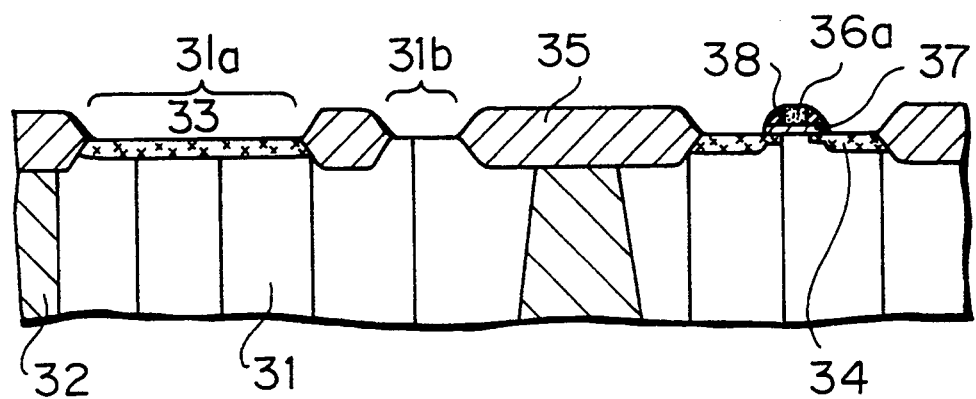
Figure 2C:
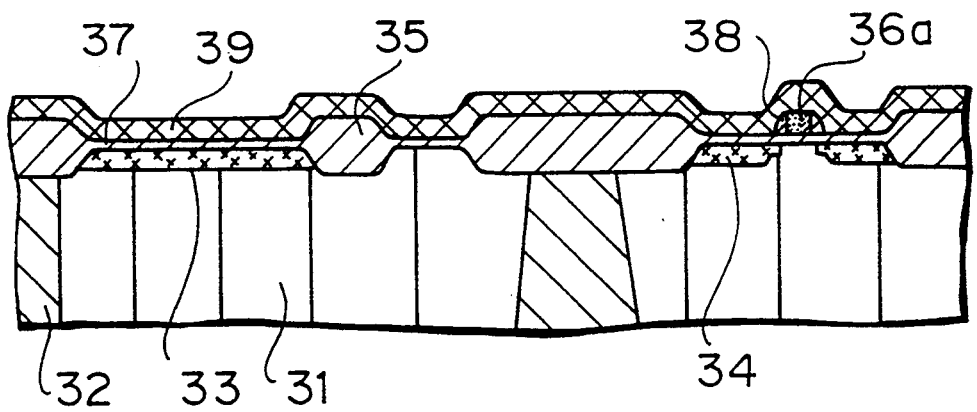
Figure 2D:
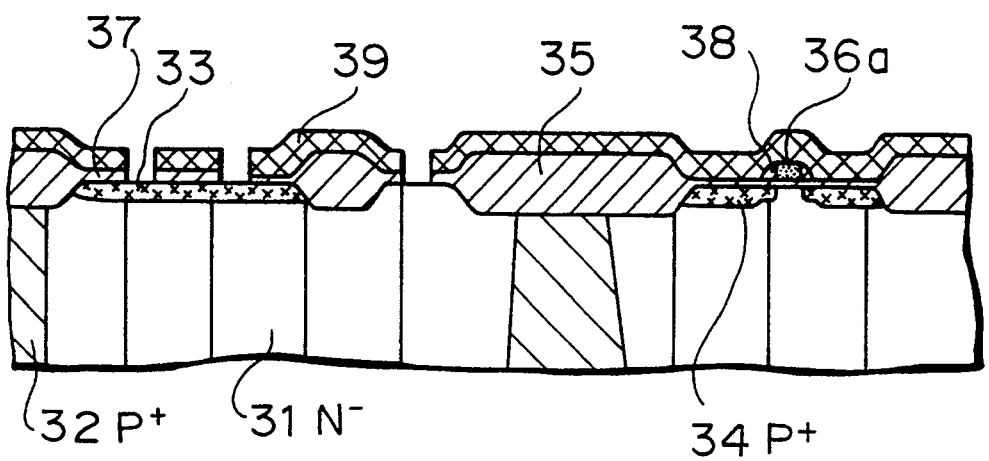
Figure 2E:
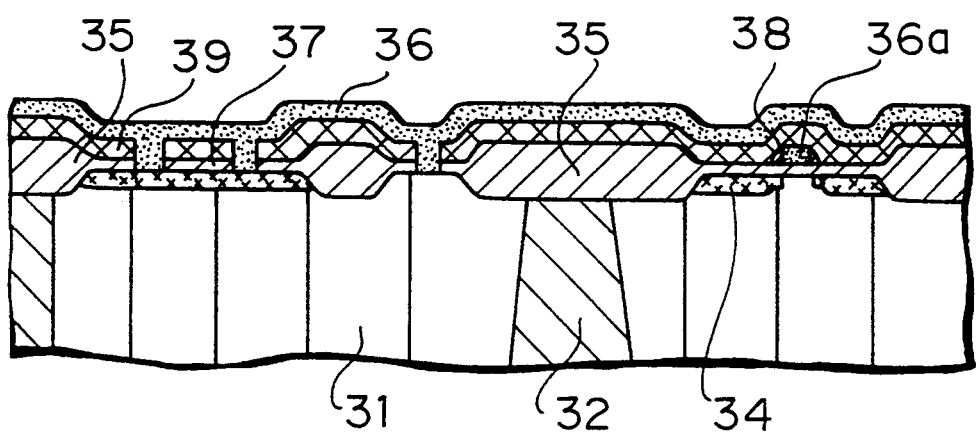
Figure 2F:
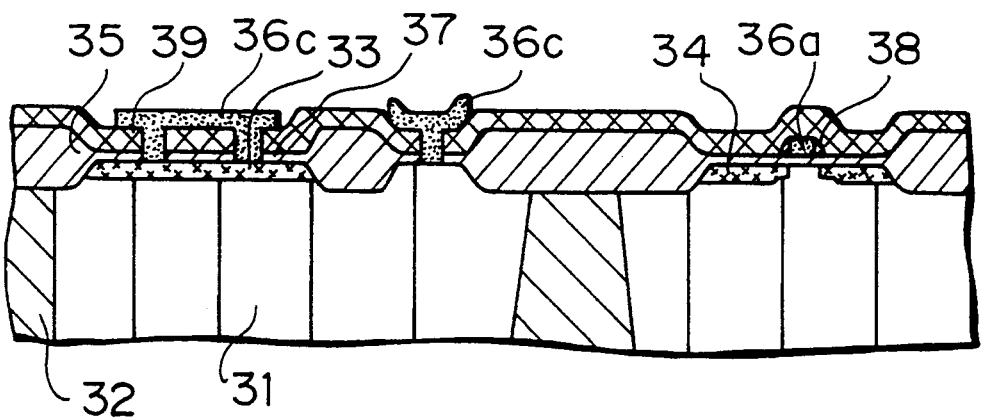
Figure 2G:
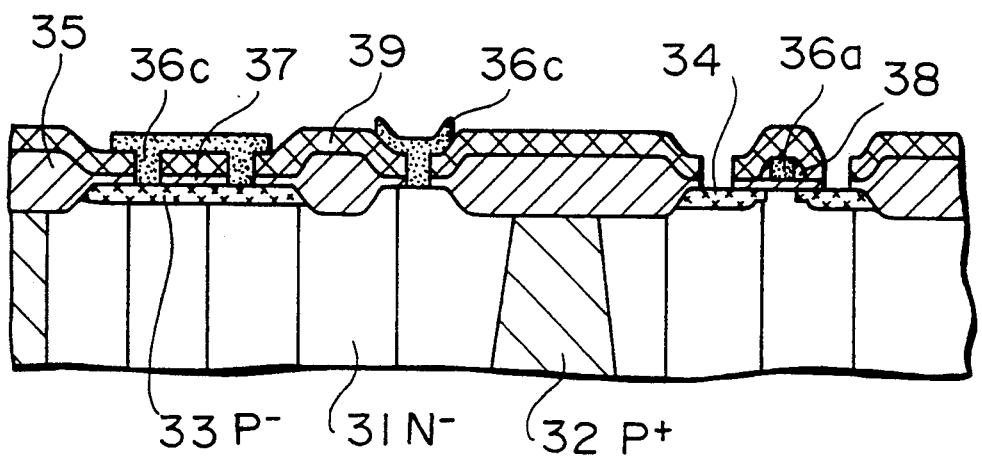
Figure 2H:
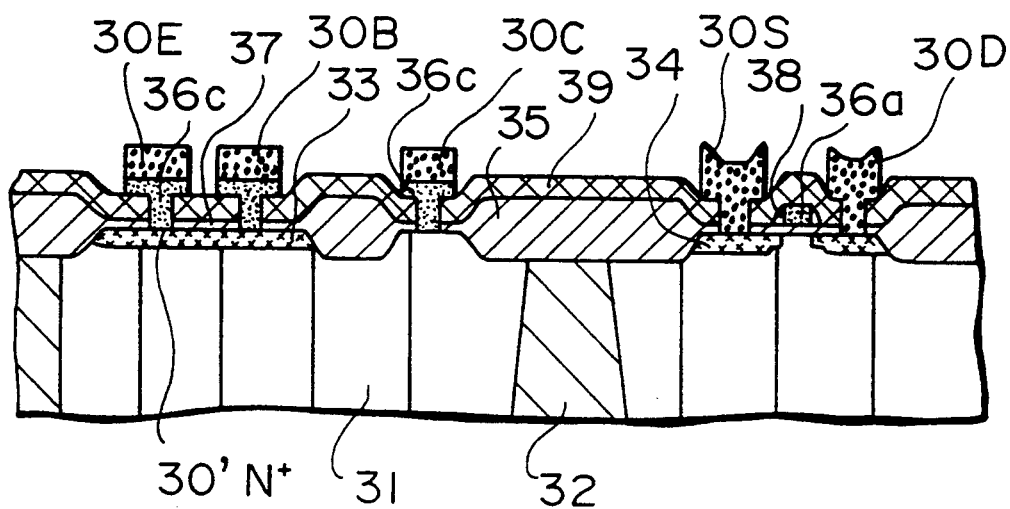
Figure 3A:
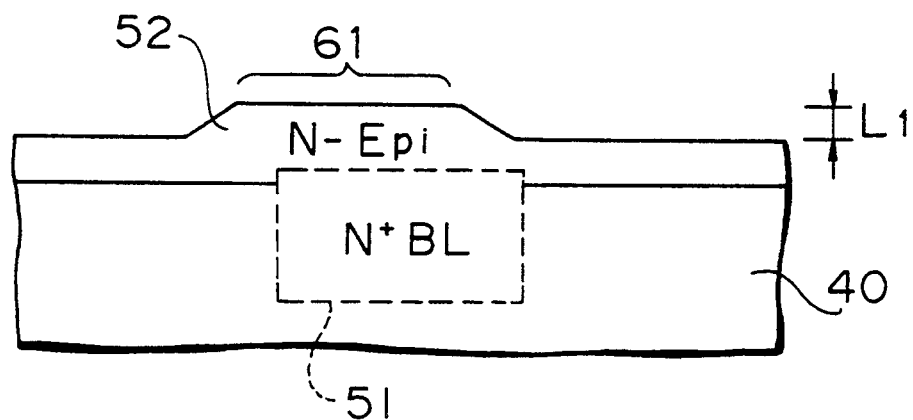
FIGS. 3-A to 3-G are fragmentary sectional views showing wafers in a process of manufacturing a bipolar transistor in a first embodiment of the invention.
Figure 3B:
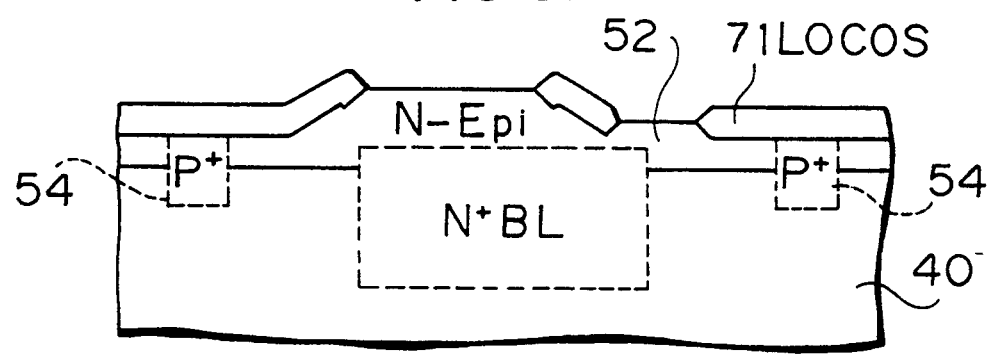
Figure 3C:
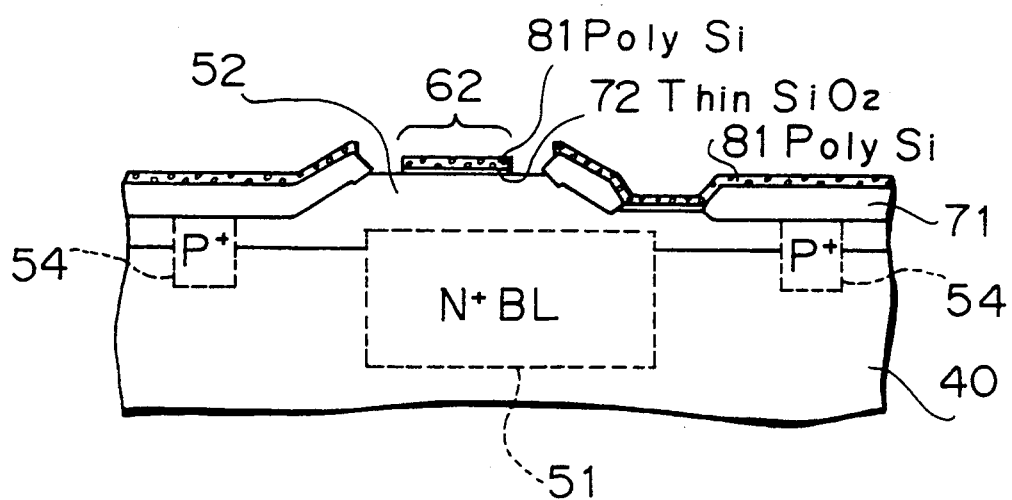
Figure 3F:
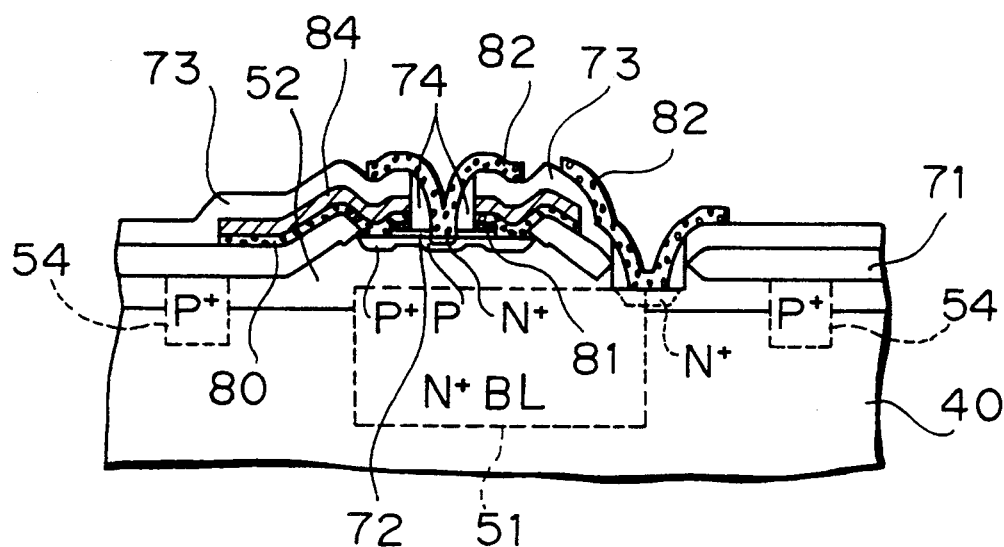
Figure 3G:
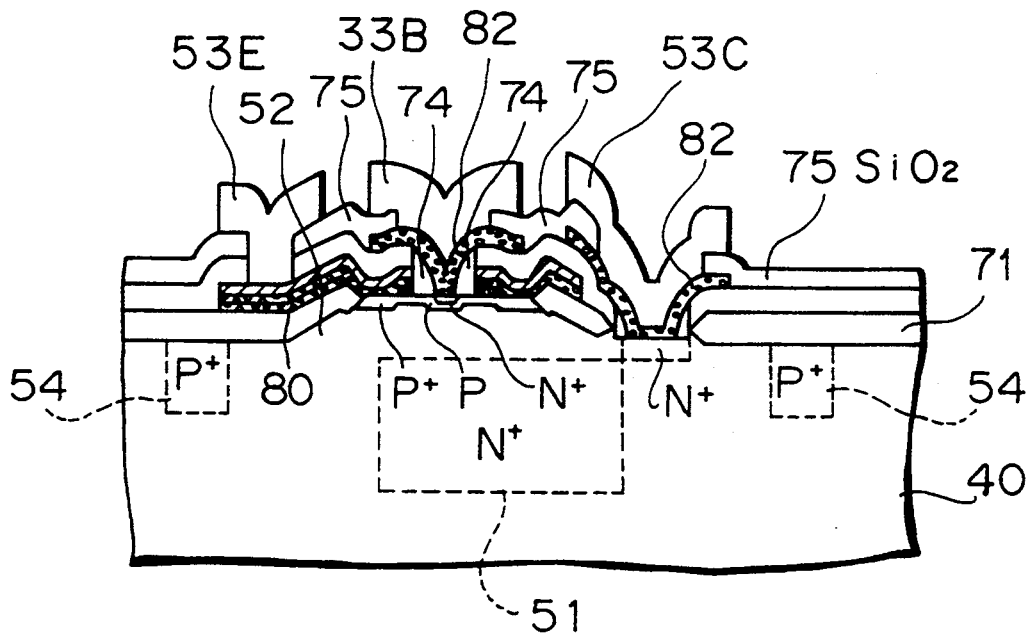

A process of manufacturing a bipolar transistor in a first embodiment of the invention will now be described with reference to FIGS. 3-A to 3-G.

(A) In the first place, a Psub <100> substrate is prepared as substrate 40, and an n -type buried layer 51 is formed in a well-known process such as Sb diffusion in a bipolar transistor region.

Then, an n-type epitaxial layer 52 with $\rho = 1.0$ $\Omega$·cm and t$=1.0$ $\mu$m is formed by the epitaxial technique.

Then, the epitaxial layer 52 is selectively etched by etching Si with the usual dry etching technique such as to leave a portion of the emitter/base formation region as shown at 61 in FIG. 3-A. The extent of this etching is shown at L1.

With this etching, sufficient inter-element isolation is obtainable even when the thickness of the LOGOS film for inter-element isolation is small. As a process condition for taper etching of the substrate using a blend gas of SiCl4N2, L1 is set to about 400 nm. As a result, a structure as shown in FIG. 3-A is obtained.

(B) Then, an inter-element isolation insulating film 71 is formed with the usual LOCOS technique. The thickness of this LOCOS oxide film is set to about 400 nm. If the oxide film thickness is excessive, the inter-element isolation region is increased due to the commonly termed bird's beak. In addition, crystal defects are generated in the substrate silicon due to stress generated at the time of the selective oxidization.

Subsequently, a p-type region 54 is formed by implanting B ions into the isolation region through the LOCOS oxide film. Thus, a structure shown in FIG. 3-B is obtained.

(C) Then, oxidization is carried out; for instance wet oxidization (steam oxidization) at 850° C. is carried out for 15 minutes, thus forming an oxide film 71 with a thickness of about 15 nm.

Then, as a first conductor 81 poly Si is deposited to about 50 nm over the entire surface by the reduced pressure CVD process.

Then, a resist is formed to cover the entire surface, and its portion corresponding to the bipolar transistor base electrode region is selectively etched away.

With the resist pattern thus formed as a mask, the laminate film 81 comprising the poly Si and oxide film is RIE etched. This step is for etching away the first conductor 81 other than that on the base electrode region 62. This etching is carried out in two steps, e.g., a first step of etching Si with SF6/Cl3F3 gas and a second step of etching SiO2 with O2/CHF3 gas. As a result, a structure shown in FIG. 3-C is obtained.

(D) As a second conductor 80 a second poly Si layer is formed to a thickness of about 50 nm by the reduced pressure CVD process. Then, in this embodiment a high-melting metal or high-melting metallic compound, e.g., WSix, is formed to about 100 nm by the CVD process. Then, a resist is formed such as to cover the base electrode region. With this resist pattern as a mask, the WSIx, second layer poly Si 88 and first layer Si 81 are RIE etched. This etching may be done using SF6/C2Cl3F3. Then, an insulator 73, e.g., SiO2, is formed to about 300 nm by the CVD process. Thus, a structure as shown in FIG. 3-D is obtained.

(E) Then, a resist is formed to cover the entire surface, and it is selectively etched to leave its portion on a bipolar transistor emitter/base formation region. With the resist pattern thus obtained as a mask, The SiO2, WSix and poly Si in the emitter/base formation region 63 are etched away. At this time, the resist on the collector electrode region 64 is etched, while at the same time etching the SiO2 and the substrate Si in this region. This step is to simultaneously etch away the first conductor 81 in the emitter/base formation region 63 and the epitaxial layer 80 in the collector electrode region 64.

This etching step is suitably carried out as two-step etching, e.g., a first step of etching SiO2 with O2/CHF3 and a second step of etching the WSix and poly Si in the emitter?base formation region 63 with SF6/C2Cl3F3 gas.

At this time, the substrate Si in the collector electrode region 64 is etched simultaneously. However, the extent of etching at this time is substantially equal to the thickness of the WSix/poly Si laminate film. The extent of etching of the collector electrode region 64 is greater than the extent L1 of etching of the epitaxial layer 52 (see FIG. 3-A). In this second step etching, a sufficient ratio of selection of SiO2 can be obtained, and thus the oxide film 72 (i.e., SiO2) can remain on the emitter/base formation region 63. Thus, no etching damage is caused. It is thus possible to obtain a structure as shown in FIG. 3-D. The holes or openings formed by the etching in the emitter/base and collector formation regions 63 and 74 are designated at 63a and 64a.

(F) Then, a link base layer is formed with BF2+ ion injection.

Then, a SiO2 spacer in the form of a side wall is formed by carrying out CVD and RIE of SiO2 continuously. The spacer 74 functions as an insulating film for emitter/base electrode isolation. For example, it is possible to realize a side wall width of 0.2 to 0.3 $\mu$m under the conditions of SiO2 CVD to 500 nm and a RIE overetching by 10%, and thus an emitter/base contact width of a quarter $\mu$m (i.e., ¼ micron or below).

Then, as a second conductor 82 emitter poly Si is formed to about 100 nm by the reduced pressure CVD.

Then, emitter/base as a diffusion region is formed by carrying out B+ ion implantation and then As+ ion implantation and then a heat treatment. At this time, a high impurity concentration layer for the collector electrode is formed simultaneously.

Subsequently, a portion of poly Si as the second conductor 82 other than that on the emitter and collector electrode regions is etched away, thus obtaining a structure as shown in FIG. 3-F.

(G) Then, an insulator 75, e.g., SiO2, is formed to a thickness of 300 nm by the CVD process. Then, the insulator (i.e., SiO2) on the emitter, base and collector contacts is etched away with a resist mask.

Then, Ti/TiN/Al-Si, poly Si/WSix, etc. is formed over the entire surface and patterned with a resist mask to form electrodes 532, 53B and 53C. Thus, a structure as shown in FIG. 3-G is obtained. In the above way, the bipolar transistor is completed.

As has been shown, in this embodiment the prior art process of forming the emitter hole is utilized to etch away the semiconductor layer (i.e., epitaxial layer) in the collector electrode region and effect further etching, while forming the high impurity concentration layer for the collector electrode with the diffusion from the emitter poly Si electrode as the second conductor. Thus, the heretofore required ion implantation step for the high impurity concentration layer formation is unnecessary, thus solving the problems in the prior art.

Since the ion implantation step for the high impurity concentration layer formation can be dispensed with, it is possible to reduce the number of necessary steps and alleviate the problem of the resist separation.

Now, a second embodiment of the invention will be described.

Figure 4A:
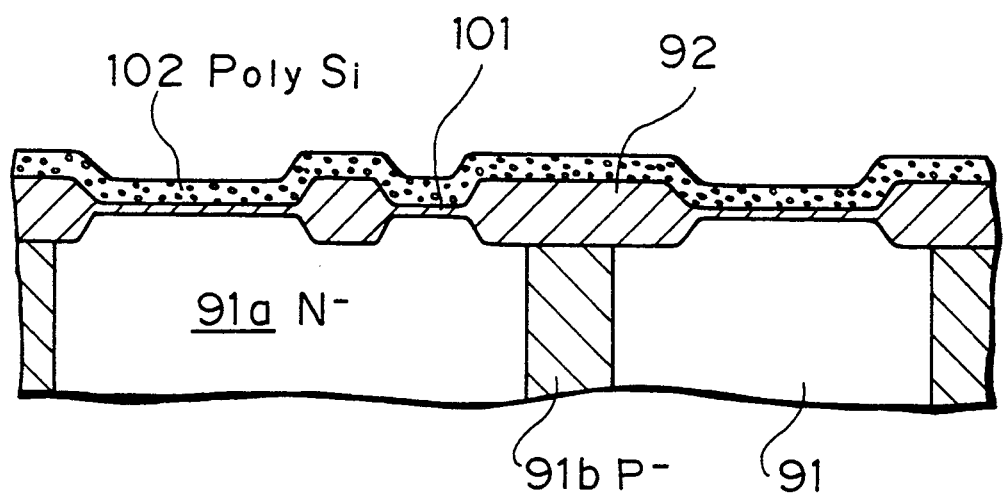
FIGS. 4-A to 4-F are fragmentary sectional views showing wafers in a process in a second embodiment of the invention.
Figure 4B:
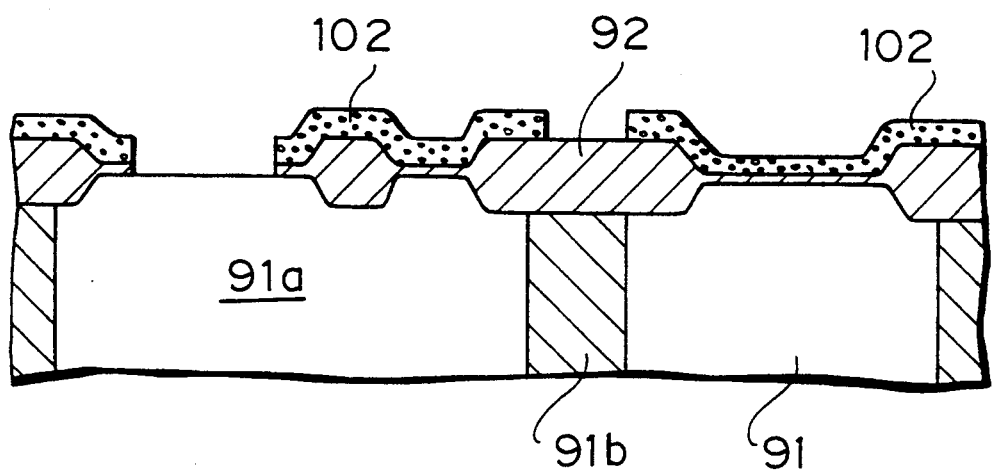
Figure 4C:
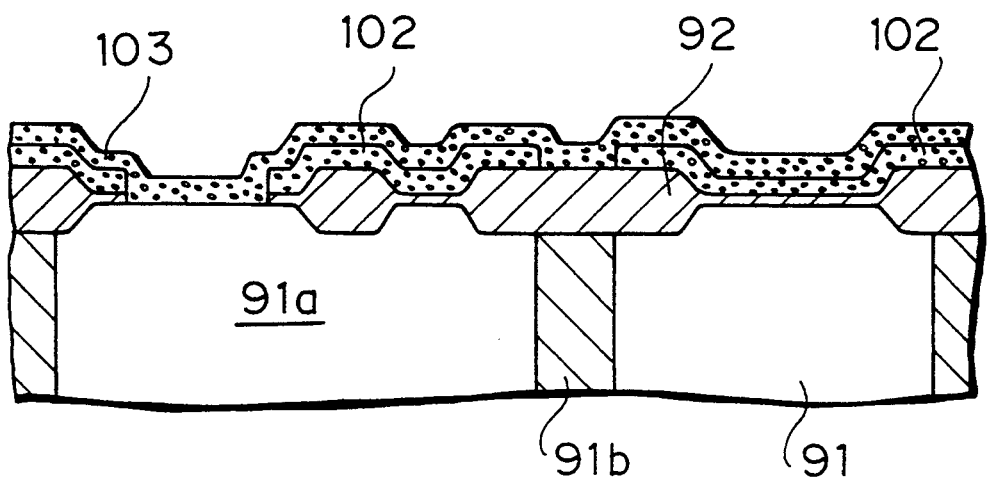
Figure 4D:
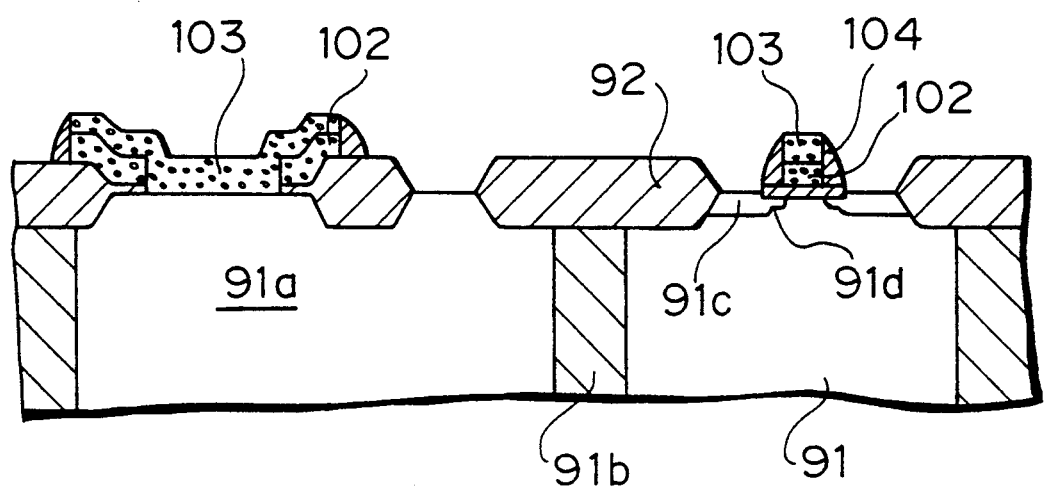
Figure 4E:
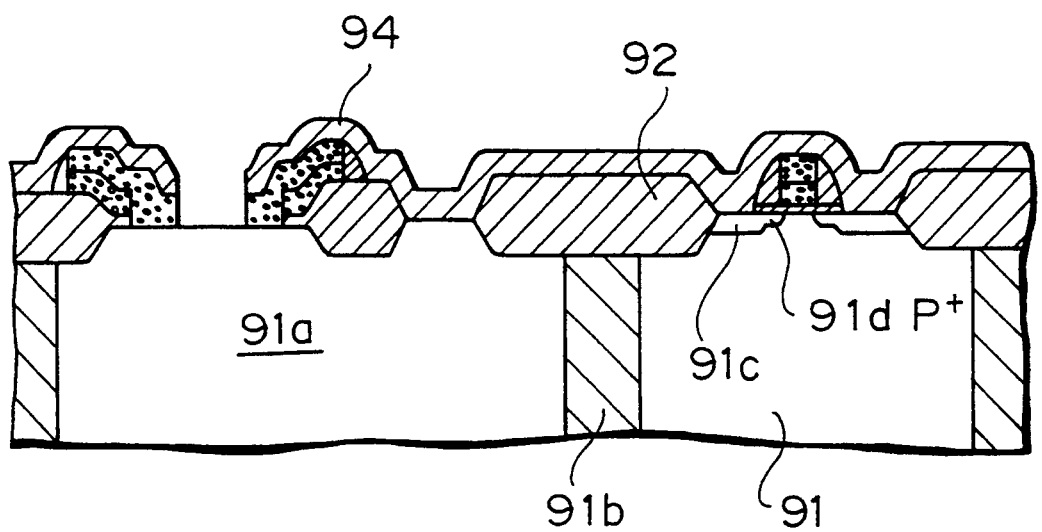
Figure 4F:
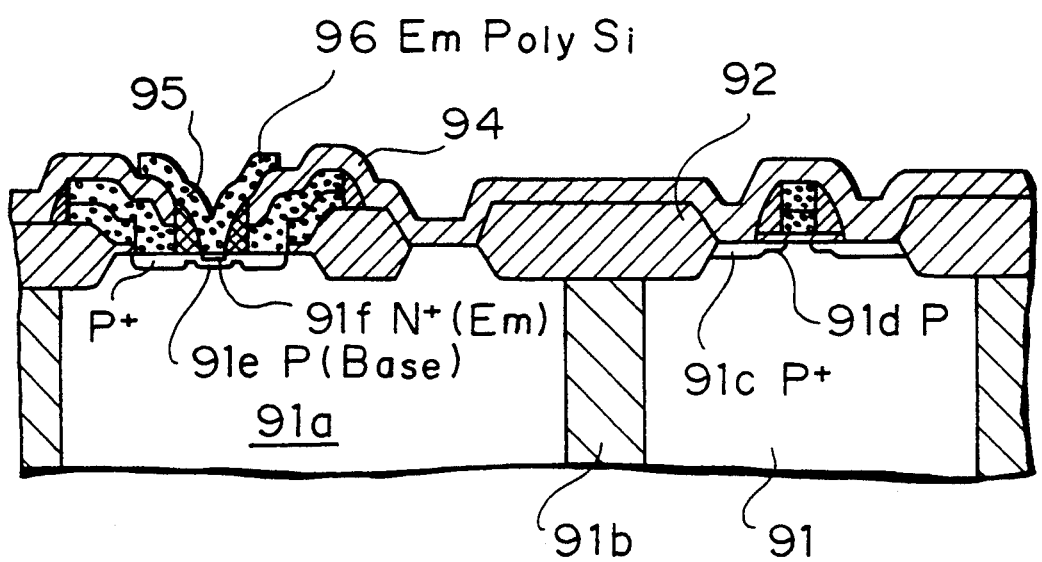

FIGS. 4-A to 4-F are fragmentary sectional views showing an upper portion of a part of Si substrate including a bipolar transistor region and a p-channel MOS transistor region in the Bi-CMOS transistor manufacture process in this embodiment.

In this embodiment, the Bi-CMOS transistor is obtained through the following steps.

In a substrate 91, as shown in FIG. 4-A, an n--type layer 91a is formed in a bipolar transistor collector region and a PMOS FET region, and a p-type isolation 91b and a field oxide film 92 are formed in a p-type isloation region. Then, a gate oxide film 101 with a thickness of 10 nm is formed by thermal oxidization in the bipolar and CMOS transistor regions, and then poly Si 102 is formed to a thickness of about 100 nm by the reduced CVD process.

Then, poly Si on a bipolar transistor active region is etched away by RIE. At this time, the gate oxide film right under the poly Si film 102 may be left by anisotropically etching the poly Si film using a blended gas composed of SF6 and C2Cl3F3 with a resist pattern mask. Then, the gate oxide film remaining on the bipolar transistor active region is wet etched with the patterned poly Si as a mask. The resultant structure is shown in FIG. 4-B.

Then, as shown in FIG. 4-C, a poly Si film 103 (i.e., second poly Si layer) is formed to a thickness of about 200 nm over the entire Si substrate surface by the reduced pressure CVD process.

Then, the poly Si 102, 103 is RIE etched such as to leave its portion on the bipolar transistor active region and PMOS transistor gate region. Then, a p-type layer 91d is formed in the PMOS transistor source and drain regions. Then, an oxide film is formed to a thickness of about 300 nm over the entire surface of the Si substrate and then etched back by RIE over the entire surface. As a result, a side wall oxide film 104 is formed on the gate electrode region (i.e., first and second poly Si layers 102 and 103), as shown in FIG. 4-D. Then a p -type layer 91c is formed by P ion implantation in the MOS transistor source and drain regions.

Then, P+ ions are implanted in poly Si in the bipolar transistor region, and N+ ions are implanted in the MOS gate electrode region.

Then, as shown in FIG. 4-E, an oxide film with a thickness of about 300 nm is formed as an inter-layer insulating film 94 over the entire Si substrate surface by the reduced pressure CVD process. Then the active region of the bipolar transistor is formed with an opening, and using a resist mask the oxide film is anisotropically etched with, for instance, a blended gas composed of CHF3 and O2, and then the poly Si film is anisotropically etched with a blended gas composed of SF6 and C2Cl3F5. In this way, the active region of the bipolar transistor may be formed with an opening without causing damage to it.

Then, as shwon in FIG. 4-F, the opening portion of the bipolar transistor active region is oxidized to about 10 nm, and then a side wall 95 of silicon nitride film is formed by the reduced CVD process and subsequent RIE. At this time, a high selection ratio of the oxide film to the silicon nitride film may be obtained by using an anisotropic etching technique using a blended gas composed of CH2F2 and CO2. Thus, at the time of RIE the oxide film present under the silicon nitride film functions as a stopper, and the opening portion of the bipolar transistor active region is not exposed to the RIE.

Subsequently, the oxide film on the active region opening portion is etched away by wet etching. Then, a base p-type region 91e and an emitter n -type region 91f are formed by introducing a base and an emitter impurity by ion implantation and annealing. The poly Si film noted above serves as the bipolar transistor emitter electrode. Thus, its other portions which are not necessary are etched away to obtain the emitter electrode 96.

Subsequently, metal lead (not shown) is formed by the usual electrode formation step.

As shown above, according to the invention it is possible to provide a semiconductor device with a bipolar transistor and a MOS FET formed on the same substrate, which can preclude damage to the bipolar transistor and hence adverse effect on the bipolar transistor characteristics by the RIE at the time of the side wall formation and also by the RIE at the time of the bipolar transistor contact formation.

Further, by using the gate electrode material of the MOS FET, which functions as a protective layer for the bipolar transistor at the time of the side wall formation, as the base electrode of the bipolar transistor as well and also isolating the base and emitter electrodes by self-matching with the insulating film formed on the side wall, it is possible to reduce the distance between the base and emitter electrodes to reduce the element area so as to reduce parasitic capacitance and improve the integration density, thus attaining performance improvement.

As has been described in the foregoing, in the method of manufacturing a semiconductor device having a bipolar transistor and a MOS transistor according to the invention, the bipolar transistor formation region is covered with a gate formation material when forming the MOS transistor gate, and the gate formation material is also used as the base electrode of the bipolar transistor, thus attaining the aim noted above of the invention.

In this method, in the step of forming the side wall oxide film over the MOS transistor gate formation region by RIE etching-back of the entire surface, the active portion of the bipolar transistor formation region is covered by the gate formation material and is thus not subject to damage, and no characteristic deterioration occurs.

Besides, the use of the gate formation material as the bipolar transistor base electrode as well has an effect of greatly reducing the distance between the emitter and base electrodes as compared to the prior art structure, thus reducing the element area to reduce the parasitic capacitance and improve the integration density so as to realize characteristic improvements.

What is claimed is:

1. A method of manufacturing a semiconductor device having a bipolar transistor and a MOS transistor comprising the steps of:

covering the bipolar transistor formation region with a gate insulating film and also with a first gate formation material at the time of the MOS transistor gate formation;

removing the first gate formation material and gate insulating film covering at least a portion of said bipolar transistor formation region, thus forming an opening in said gate insulating film and first gate formation material;

forming a second gate formation material;

removing other portions of said first and second gate formation materials on said bipolar transistor formation region and the MOS transistor gate formation region;

forming an inter-layer insulating film; and removing the inter-layer insulating film and first and second gate formation materials on at least a portion of the bipolar transistor formation region, thus forming a second opening in said first-mentioned opening in said inter-layer insulating film and first and second gate formation materials.

2. A method of manufacturing a semiconductor device having a bipolar transistor and a MOS transistor comprising the steps of:

covering the bipolar transistor formation region with a gate insulating film and also with a first gate formation material at the time of the MOS transistor gate formation;

removing the first gate formation material and gate insulating film covering at least a portion of said bipolar transistor formation region, thus forming an opening in said gate insulating film and first gate formation material;

forming a second gate formation material;

removing other portions of said first and second gate formation materials on said bipolar transistor formation region and the MOS transistor gate formation region;

forming an inter-layer insulating film;

removing the inter-layer insulating film and first and second gate formation materials on at least a portion of the bipolar transistor formation region, thus forming a second opening in said first-mentioned opening in said inter-layer insulating film and first and second gate formation materials;

forming an insulating film side wall within said first-mentioned opening; and burying a conductor in said first-mentioned opening.

3. The method of manufacturing a semiconductor device according to claims 1 or 2, wherein said first gate formation material is polysilicon.

4. The method of manufacturing a semiconductor device according to claims 1 or 2, wherein said conductor buried in said opening is polysilicon.

5. A method of manufacturing a semiconductor comprising the steps of:
forming a buried layer;
forming an epitaxial layer;
etching said epitaxial layer such as to leave a portion thereof on a portion of an emitter/base formation region of a bipolar transistor;
forming a first conductor; and
removing a portion of said first conductor on a base electrode region of said bipolar transistor; and
removing the first conductor on said emitter/base formation region and also simultaneously removing the epitaxial layer on a collector electrode region of said bipolar transistor.

6. A method of manufacturing a semiconductor comprising the steps of:
forming a buried layer;
forming an epitaxial layer;
etching said epitaxial layer such as to leave a portion thereof on a portion of an emitter/base formation region of a bipolar transistor;
forming a first conductor;
removing a portion of said first conductor on a base electrode region of said bipolar transistor;
removing the first conductor on said emitter/base formation region and also simultaneously removing the epitaxial layer on a collector electrode region of said bipolar transistor;
forming a second conductor; and
forming high impurity concentration diffusion regions for emitter and collector electrode simultaneously with said second conductor as a source of diffusion.

7. The method of manufacturing a semiconductor device according to claim 5, wherein said first and second conductors are polycrystalline silicon or a lamination of polycrystalline silicon and a high-melting metal.

8. The method of manufacturing a semiconductor device according to claim 6, wherein said first and second conductors are polycrystalline silicon or a lamination between polycrystalline silicon and a high-melting metal.

* * * * *